US011061334B2

(12) United States Patent
Deguenther

(10) Patent No.: US 11,061,334 B2
(45) Date of Patent: Jul. 13, 2021

(54) PUPIL FACET MIRROR, ILLUMINATION OPTICS AND OPTICAL SYSTEM FOR A PROJECTION LITHOGRAPHY SYSTEM

(71) Applicant: Carl Zeiss SMT GmbH, Oberkochen (DE)

(72) Inventor: Markus Deguenther, Florstadt (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/921,841

(22) Filed: Jul. 6, 2020

(65) Prior Publication Data

US 2020/0333712 A1 Oct. 22, 2020

Related U.S. Application Data

(63) Continuation of application No. PCT/EP2018/082511, filed on Nov. 26, 2018.

(30) Foreign Application Priority Data

Jan. 8, 2018 (DE) .................... 102018200167.7

(51) Int. Cl.
*G03F 7/20* (2006.01)
(52) U.S. Cl.
CPC .......... *G03F 7/70075* (2013.01); *G03F 7/701* (2013.01); *G03F 7/702* (2013.01)
(58) Field of Classification Search
CPC .. G03F 7/702; G03F 7/70116; G03F 7/70425; G03F 7/70075; G03F 7/70883
USPC ....................................... 355/52, 53, 67–71
See application file for complete search history.

(56) References Cited

U.S. PATENT DOCUMENTS

| 5,638,211 | A | * | 6/1997 | Shiraishi ................. G03F 7/201 355/53 |
| 6,859,515 | B2 | | 2/2005 | Schultz et al. |
| 2004/0248043 | A1 | * | 12/2004 | Shiraishi ............ G03F 7/70425 430/311 |
| 2006/0256315 | A1 | | 11/2006 | Sato et al. |
| 2009/0051890 | A1 | * | 2/2009 | Mann ....................... G03F 7/702 355/67 |
| 2011/0001947 | A1 | * | 1/2011 | Dinger ................ G03F 7/70116 355/67 |
| 2013/0070221 | A1 | * | 3/2013 | Bittner ................ G03F 7/70883 355/30 |
| 2013/0128251 | A1 | | 5/2013 | Mann |

(Continued)

FOREIGN PATENT DOCUMENTS

DE 10 2010 040 811 A1 3/2012
DE 10 2012 220 597 A1 5/2014

(Continued)

OTHER PUBLICATIONS

Translation of International Search Report for corresponding PCT/EP2018/082511, dated Feb. 28, 2019.

(Continued)

*Primary Examiner* — Hung Nguyen
(74) *Attorney, Agent, or Firm* — Fish & Richardson P.C.

(57) ABSTRACT

In an optical system for a projection exposure apparatus, the angle space of the illumination radiation of the projection optical unit at the reticle is twice as large in a first direction as the angle space of the illuminating radiation of the illuminating optical unit.

25 Claims, 3 Drawing Sheets

(56) References Cited

U.S. PATENT DOCUMENTS

| | | |
|---|---|---|
| 2015/0192860 A1 | 7/2015 | Fischer |
| 2015/0355555 A1* | 12/2015 | Maul .................. G03F 7/70075 355/71 |
| 2016/0085061 A1 | 3/2016 | Schwab |
| 2017/0228490 A1 | 8/2017 | Chung et al. |
| 2017/0248851 A1 | 8/2017 | Endres et al. |

FOREIGN PATENT DOCUMENTS

| | | |
|---|---|---|
| DE | 10 2014 208 770 A1 | 1/2015 |
| DE | 10 2014 217 611 A1 | 3/2016 |
| DE | 10 2014 223 453 A1 | 5/2016 |
| DE | 10 2015 216 443 A1 | 3/2017 |
| EP | 1 228 481 B1 | 8/2005 |

OTHER PUBLICATIONS

German Examination Report, with translation thereof, for corresponding DE Appl No. 10 2018 200 167.7, dated Sep. 25, 2018.
Sascha Migura et al., "Anamorphic high-NA EUV Lithography Optics", 31$^{st}$ European Mask and Lithography Conference, Proc. of SPIE vol. 9661, Sep. 4, 2015.

* cited by examiner

PUPIL FACET MIRROR, ILLUMINATION OPTICS AND OPTICAL SYSTEM FOR A PROJECTION LITHOGRAPHY SYSTEM

CROSS-REFERENCE TO RELATED APPLICATIONS

The present application is a continuation of, and claims benefit under 35 USC 120 to, international application PCT/EP2018/082,511, filed Nov. 26, 2018, which claims benefit under 35 USC 119 of German Application No. 10 2018 200 167.7, filed Jan. 8, 2018. The entire disclosure of these applications are incorporated by reference herein.

FIELD

The disclosure relates to an optical system for a projection exposure apparatus, to a pupil facet mirror for an illumination optical unit, and to an illumination optical unit. The disclosure further relates to a microlithographic projection exposure apparatus. In addition, the disclosure relates to a method for exposing a wafer with the aid of a projection exposure apparatus and a microstructured or nanostructured component that is produced using such a method.

BACKGROUND

Projection exposure apparatuses with high numerical apertures are known. However, large angles of incidence of the illumination radiation can lead to shadowing effects due to the mask structures.

SUMMARY

The disclosure seeks to provide an improved optical system for a projection exposure apparatus.

In some embodiments, the disclosure provides optical system in which the angle space of the illumination radiation of the projection optical unit at the reticle is twice as large in a first direction as the angle space of the illumination radiation of the illumination optical unit. This first direction extends for example parallel to the scanning direction of the projection exposure apparatus. The scanning direction can be recognized in the illumination optical unit based on the extent of the illuminated reticle: the reticle is significantly shorter in the scanning direction than in a direction orthogonal to it.

Halving the angle space in a first direction can be achieved by virtue of the fact that the opening of the beam of the illumination radiation in the beam path of the projection optical unit can lead to a circular angle space on the wafer, while in comparison thereto the opening of the beam of the illumination radiation for illuminating the reticle in the first direction is reduced to half that. In the case of astigmatic imaging by the projection optical unit, the angle space of the illumination radiation in the beam path of the projection optical unit can be elliptical.

If reference is made to the opening or angle space of the beam of the illumination radiation in the beam path of the projection optical unit, then this is understood to mean only those rays which lie within the aperture recorded by the projection optical unit, that is to say which can actually reach the wafer.

In the first direction, the numerical aperture of the illumination optical unit can be just about half as large as the numerical aperture of the projection optical unit.

According to the disclosure, it has been recognized that the maximum angle of incidence of the illumination radiation on the reticle can be reduced in this way. The consequence of halving the illumination pupil to the imaging of the reticle can be compensated for by a subsequent second exposure with the other half of the illumination pupil. This will be described in more detail below.

According to a further aspect of the disclosure, the reticle is tilted relative to the beam path of the illumination radiation in such a way that its surface normal lies entirely in the beam of the illumination radiation of the projection optical unit. Because of the different opening angles of the illumination radiation that is incident on the reticle and the illumination radiation that is reflected by the reticle, the surface normal of the reticle may no longer lies symmetrically between the beam of the illumination optical unit and that of the projection optical unit, but entirely within the beam of the projection optical unit.

According to a further aspect of the disclosure, the optical system includes a semicircular pupil facet mirror. The pupil facet mirror is described in more detail below.

According to a further aspect of the disclosure, the optical system includes a projection optical unit with a numerical aperture on the object side of at least 0.55, such as at least 0.7.

According to a further aspect of the disclosure, the angle space of the illumination radiation of the projection optical unit on the reticle is the same size in a second direction as the angle space of the illumination radiation of the illumination optical unit. The second direction can be oriented perpendicular to the first direction.

To resolve structures of the reticle at the resolution limit, only a part of one of the two first orders of diffraction of the illumination radiation reflected at the reticle is used for projecting the reticle onto the wafer.

In addition to the illumination radiation that is specularly reflected at the reticle, that is to say the zero order of diffraction, for example only a part of either the +1 or the −1 order of diffraction is contained in the beam of the projection optical unit. The +1/−1 order of diffraction can be trimmed, that is to say can be contained only partially, for example not completely, in the beam of the projection optical unit. This applies correspondingly to higher orders of diffraction.

According to a further aspect of the disclosure, both the reticle and the wafer are rotatable through 180° in each case. They can be correspondingly rotatably mounted on a reticle or wafer holder.

This makes it possible to illuminate the reticle with the other half of the illumination pupil. The same mask structures, i.e. the same mask inserted in the reticle, are imaged here onto the same regions of the wafer. This is to be distinguished both from double exposure, in which different masks are imaged successively onto the same region of the wafer using different illumination pupils, and from double patterning, in which the photoresist applied on the wafer is developed between two exposures of the same region on the wafer.

According to a further aspect of the disclosure, the projection optical unit has a plurality of mirrors, wherein the first two mirrors (e.g., the first three mirrors, the first four mirrors) in the beam path of the projection optical unit have a simply contiguous reflection surface.

In this way, fractionated reflection surface of these mirrors of the projection optical unit can be avoided.

Avoiding a fractionated reflection surface makes it possible, for example, to separate the beam paths between the reticle and the illumination optical unit from those between the reticle and the projection optical unit.

The disclosure also seeks to provide an improved illumination optical unit for a projection exposure apparatus and a pupil facet mirror for an illumination optical unit of a projection exposure apparatus.

An illumination optical unit that can be designed such that only half an illumination pupil is available for illuminating the reticle. A pupil facet mirror can have a semicircular configuration.

The illumination optical unit can have an exit-side aperture, which is smaller in a first direction than in a second direction perpendicular thereto. The ratio of the diameters of the exit-side aperture of the illumination optical unit in the first and second directions is, for example, at most 0.7, such as at most 0.6. For example, it can be 0.5.

This can be achieved by trimming off half of a circular exit-side aperture relative to the latter. This is possible, for example, by way of a suitable design of the pupil facet mirror.

The illumination optical unit can have a semicircular aperture.

The pupil facet mirror can also be semi-elliptical. This is understood to mean that it has the shape of half of a symmetrically divided ellipse.

The shape of the pupil facet mirror is understood to mean its envelope, that is to say the shape of its smallest convex envelope. The shape specifies the region in which the pupil facets can be arranged.

According to a further aspect of the disclosure, an illumination optical unit, which only provides half an illumination pupil for illuminating the reticle, is formed by a stop for blocking half of the illumination pupil.

According to the disclosure, it has been recognized that by providing only one half of the illumination pupil, the opening of the beam of the illumination radiation for illuminating the reticle can be reduced to one half in one direction. In this way, the maximum angle of incidence of the illumination radiation onto the mask can be reduced. This can reduce shadowing effects.

The disclosure also seeks to provide an improved improve a microlithographic projection exposure apparatus.

A projection exposure apparatus can include an optical system according to the description above.

The advantages are evident from those already described.

The projection exposure apparatus can be an EUV projection exposure apparatus. It can include a radiation source for generating illumination radiation in the EUV range, such as in the wavelength range of less than 30 nm, e.g., for illuminating illumination radiation with a wavelength of 13.5 nm or 7 nm.

The disclosure also seeks to provide an improved method for exposing a wafer using a projection exposure apparatus.

The disclosure provides a method in which a reticle is projected onto the wafer twice in succession, wherein the reticle and the wafer are rotated in each case through 180° about the optical axis between the two exposure steps.

In this way, it is possible to use the two halves of an illumination pupil sequentially for illuminating the reticle and imaging the structures of the reticle onto the wafer. In this way, the effect of the pupil halving described above can be compensated, for example substantially completely compensated.

The method is a double exposure method.

The disclosure also seeks to provide an improved microstructured or nanostructured component.

The disclosure provides a method of producing a corresponding component using the previously described method.

Due to the reduced shadowing effects simultaneously with a high numerical aperture, for example of the projection optical unit, the precision of the structures on the wafer can be further improved.

BRIEF DESCRIPTION OF THE DRAWINGS

Further details and advantages of the disclosure will become apparent from the description of exemplary embodiments with reference to the figures, in which.

DESCRIPTION OF EXEMPLARY EMBODIMENTS

Figure 1:
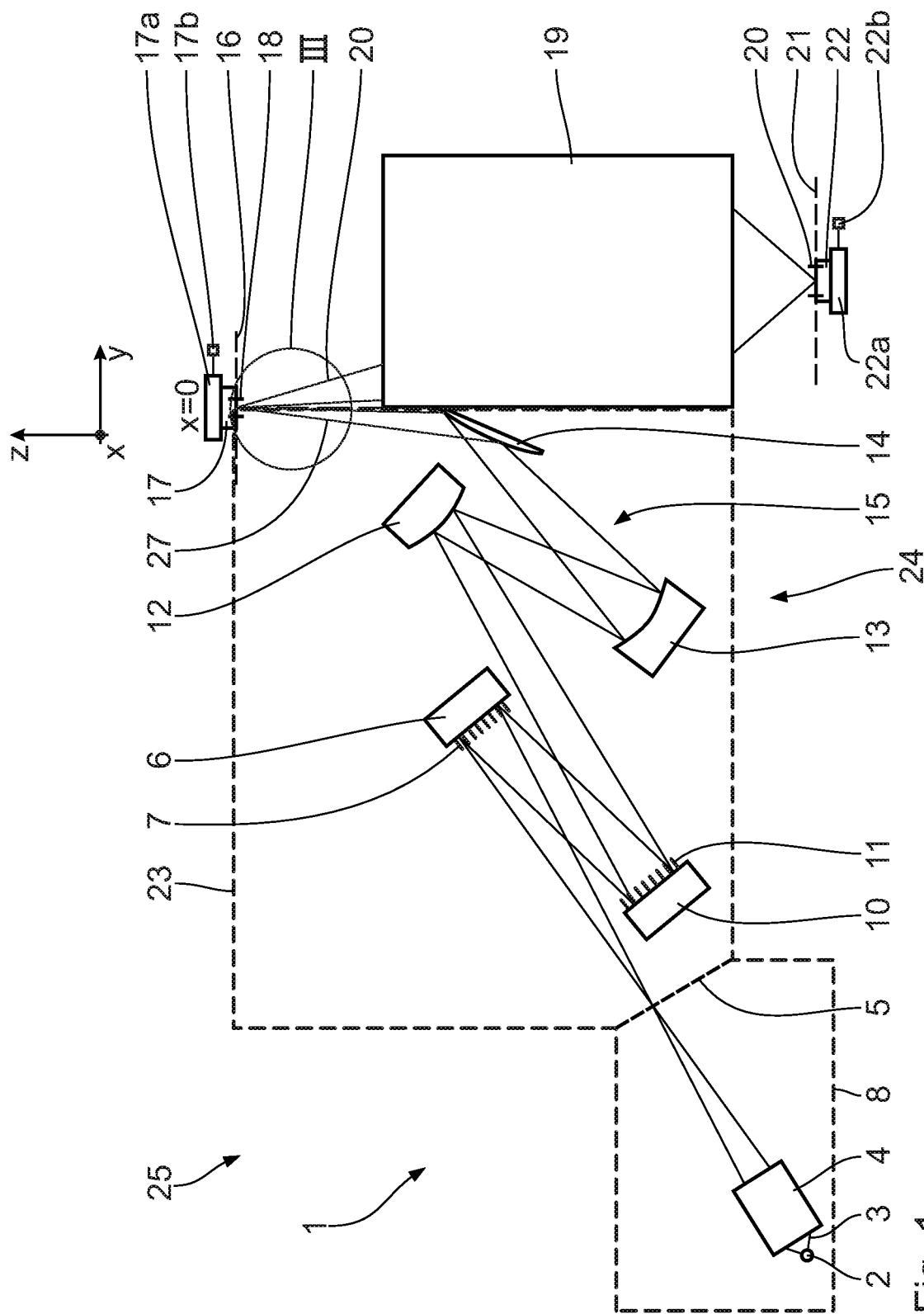
FIG. 1 schematically shows a meridional section through a microlithographic projection exposure apparatus.

The general details of a microlithographic projection exposure apparatus 1 that is known per se are described first as an example below. Reference is made here to DE 10 2012 220 597 A1 as a representative thereof, which is hereby fully incorporated in the present application as part thereof. This reference is not to be understood as limiting. Deviations in different details of the projection exposure apparatus 1 are possible.

A microlithographic projection exposure apparatus 1 serves for producing a microstructured or nanostructured electronic semiconductor component. A radiation source 2 emits EUV radiation used for illumination in the wavelength range of, for example, between 5 nm and 30 nm. The radiation source 2 can be a GDPP (gas discharge produced plasma) source or an LPP (laser produced plasma) source. A radiation source based on a synchrotron or a free electron laser (FEL) may also be used for the radiation source 2. Information concerning such a radiation source can be found by the person skilled in the art in U.S. Pat. No. 6,859,515 B2, for example. EUV illumination light or illumination radiation in the form of an imaging light beam 3 is used for illumination and imaging within the projection exposure apparatus 1. The imaging light beam 3 downstream of the radiation source 2 first passes through a collector 4, which can be, for example, a known nested collector having a multi-shell construction, or alternatively an ellipsoidally shaped collector then arranged downstream of the radiation source 2. A corresponding collector is known from EP 1 225 481 A. The radiation source 2 and the collector 4 can be components of a radiation source module 8.

Downstream of the collector 4, the EUV illumination light 3 first passes through an intermediate focal plane 5, which can be used for separating the imaging light beam 3 from undesirable radiation or particle portions. After passing through the intermediate focal plane 5, the imaging light beam 3 is first incident on a field facet mirror 6 having field facets 7. The field facet mirror 6 constitutes a first facet mirror of the projection exposure apparatus 1.

In order to facilitate the description of positional relationships, a Cartesian global xyz-coordinate system is in each case depicted in the drawing. In FIG. 1, the x-axis extends perpendicularly to the plane of the drawing and out of the latter. The y-axis extends toward the right in FIG. 1. The z-axis extends toward the top in FIG. 1.

The field facets 7 are switchable between in each case three different tilt positions. Depending on the embodiment of the field facet mirror 6, all or some of the field facets 7 are also switchable between more than three different tilt positions. For this purpose, each of the field facets is connected to an actuator. The actuators of all tiltable field facets 7 can be controlled via a central control device.

After reflection at the field facet mirror 6, the imaging light beam 3 that has been split into imaging light partial beams assigned to the individual field facets 7 is incident on a pupil facet mirror 10, which will be described in more detail below. The respective imaging light partial beam of the entire imaging light beam 3 is guided along a respective imaging light channel.

Figure 2:
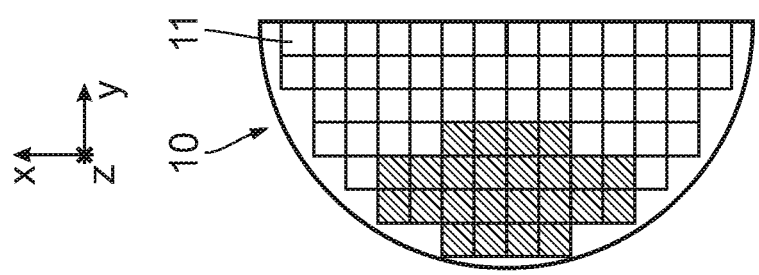
FIG. 2 schematically shows a plan view of the pupil facet mirror of the illumination optical unit of the projection exposure apparatus according to FIG. 1.

FIG. 2 very schematically shows an exemplary facet arrangement of pupil facets 11 of the pupil facet mirror 10. The pupil facet mirror 10 constitutes a second facet mirror of the projection exposure apparatus 1. The pupil facets 11 are arranged on a carrier plate of the pupil facet mirror 10. The pupil facets 11 are arranged in lines and columns in an x/y-grid. Alternatively, the pupil facets 11 are arranged on a hexagonal grid. The pupil facets 11 have square reflection surfaces. Other forms of reflection surfaces are also possible, for example rectangular, round or polygonal surfaces, for example hexagonal or octagonal surfaces. Pupil facets 11 that are arranged in the form of a rhombus are also possible.

Exactly one pupil facet 11 is assigned to each imaging light partial beam of the EUV illumination light 3 that is reflected by one of the field facets 7 in one of the three tilt positions, with the result that a facet pair that is impinged upon in each case and has exactly one of the field facets 7 and exactly one of the pupil facets 11 specifies the imaging light channel for the associated imaging light partial beam of the EUV illumination light 3. Thus, in each tilt position of the respective field facet 7, the field facet 7 is assigned exactly one pupil facet 11 for deflecting the EUV illumination light 3 in the direction of the pupil facet 11.

The channel-by-channel assignment of the pupil facets 11 to the field facets 7 is implemented on the basis of a desired illumination by the projection exposure apparatus 1. On account of the different field facet tilt positions, each of the field facets 7 can therefore specify different imaging light channels. Each of the field facets 7 is assigned a set of pupil facets 11 corresponding to the number of tilt positions across all of its tilt positions.

In an alternative embodiment, the field facets 7 can also be switchable between two tilt positions, between four tilt positions or between even more tilt positions and can thereby specify in each case one imaging light channel. The number of the pupil facets 11 in the respective pupil facet set is then correspondingly larger.

In addition to field facets 7, which are switchable between a plurality of tilt positions, the field facet mirror 6 can also have field facets 7 that are not switchable, but rather are permanently assigned to one pupil facet. Such a variant with non-switchable field facets 7 is used, for example, when the different illumination settings to be specified overlap such that light from specific identical directions is used for all illumination settings to be specified, so that specific pupil facets are always impinged upon by the EUV illumination light, regardless of the illumination setting to be specified.

The pupil facets 11 of the pupil facet mirror 10 that are impinged upon by the illumination light 3 due to an instantaneous tilt position of the field facets 7 are highlighted by way of example in FIG. 2. An illumination setting which corresponds to half an x-dipole setting, such as precisely one of the poles of such an x-dipole setting, is illustrated by way of example in FIG. 2. This illumination setting corresponds to an illumination angle distribution that can be specified via the projection exposure apparatus 1. The pupil facets 11 impinged upon by the illumination light 3 form at least one contiguous pupil facet group in each illumination setting. In principle, depending on the instantaneous tilt positions of the field facets 7, illumination settings with non-contiguous distributions can also be implemented by pupil facets 11 impinged upon by the illumination light 3. Mixed forms of illumination settings with at least one contiguous pupil facet group and with at least one pupil facet 11 that is impinged upon in an isolated manner are also possible. Such an illumination setting with pupil facets 11 that are impinged upon in an isolated manner can be implemented in cases in which there is a significantly larger number of pupil facets as compared to the number of field facets, wherein the pupil facets on the pupil facet mirror 10 are to be impinged upon as evenly as possible, for example, with the smaller number of the field facets. If the illumination setting has at least one contiguous pupil facet group, the pupil facet group contains at least two pupil facets 11.

Via the pupil facet mirror 10 (FIG. 1) and a downstream transfer optical unit 15 has three EUV mirrors 12, 13, 14, the field facets 7 are imaged into an object plane 16 of the projection exposure apparatus 1. The EUV mirror 14 is embodied as a mirror for grazing incidence (grazing incidence mirror). Arranged in the object plane 16 is a reticle 17, from which an illumination region that coincides with an object field 18 of a downstream projection optical unit 19 of the projection exposure apparatus 1 is illuminated with the EUV illumination light 3. The illumination region is also referred to as an illumination field. The object field 18 is rectangular or arcuate depending on the concrete embodiment of an illumination optical unit of the projection exposure apparatus 1. The imaging light channels are superimposed in the object field 18. The EUV illumination light 3 is reflected from the reticle 17. The reticle 17 is held by a reticle holder 17a, which is displaceable in a driven manner along the displacement direction y with the aid of a schematically indicated object displacement drive 17b.

It is possible to dispense with the transfer optical unit 15 provided that the pupil facet mirror 10 is arranged directly in an entry pupil of the projection optical unit 19.

The projection optical unit 19 images the object field 18 in the object plane 16 into an image field 20 in an image plane 21. Disposed in the image plane 21 is a wafer 22 bearing a light-sensitive layer, which is exposed during the projection exposure via the projection exposure apparatus 1. The wafer 22, that is to say the substrate onto which imaging is effected, is held by a wafer or wafer holder 22a, which is displaceable, with the aid of a wafer displacement drive 22b that is likewise indicated schematically, along the displacement direction y synchronously with the displacement of the reticle holder 17a. During the projection exposure, both the reticle 17 and the wafer 22 are scanned in a synchronized manner in the y-direction. The projection exposure apparatus 1 is embodied as a scanner. The scanning direction y is the object displacement direction.

The field facet mirror 6, the pupil facet mirror 10 and the mirrors 12 to 14 of the transfer optical unit 15 are constituent parts of an illumination optical unit 23 of the projection exposure apparatus 1.

Together with the projection optical unit 19, the illumination optical unit 23 forms an optical system 24 of the projection exposure apparatus 1.

Together with the radiation source module 8, the illumination optical unit 23 forms an illumination system 25 of the projection exposure apparatus 1.

Further details of the projection exposure apparatus 1, of the illumination optical unit 23, and of the pupil facet mirror 10, are described below.

The illumination optical unit 23 can preferably have a high numerical aperture, such a numerical aperture of at least 0.55 (e.g., at least 0.65, at least 0.7). According to the disclosure, however, it has been recognized that large angles of incidence of the illumination radiation in the region of the reticle 17 can lead to undesired shadowing effects.

For reasons of radiation guidance of the illumination radiation, the beam path of the illumination radiation of the illumination optical unit 23 is usually tilted to a normal 26 of the reticle 17 such that the beam path of the illumination optical unit 23 is free of overlap with respect to the beam path of the projection optical unit 19. The beam path of the illumination optical unit 23 can be tilted such that it does not overlap in the beam path of the projection optical unit 19 with the beam that is specularly reflected by the reticle 17, that is to say the illumination radiation diffracted into the zero order.

Shadowing effects can be at least partially compensated by an anamorphic embodiment of the projection optical unit 19. However, this leads to a reduction in the transported information and thus to a reduction in the throughput of the projection exposure apparatus 1. The disclosure described here can be combined with an anamorphic embodiment of the projection optical unit 19. An advantageous design will be discussed later.

Provision is made according to the disclosure for reducing the maximum angle of incidence of the illumination radiation at the reticle 17 by way of reducing the opening of the beam 3 of the illumination radiation in the beam path of the illumination optical unit 23 at the reticle 17.

This can be achieved, for example, by using merely a semicircular pupil facet mirror 10 instead of a circular pupil facet mirror 10 (see FIG. 2).

Figure 4:
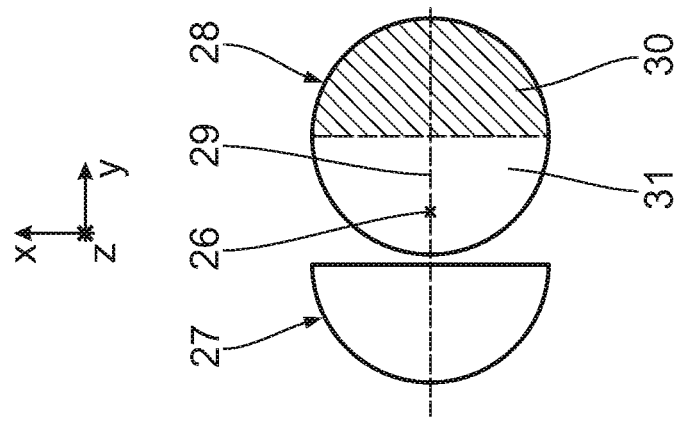
FIG. 4 schematically shows a section along the line Iv-Iv according to FIG. 3 through the beams of the illumination radiation of the illumination optical unit and the projection optical unit in the region of the reticle.
Figure 3:
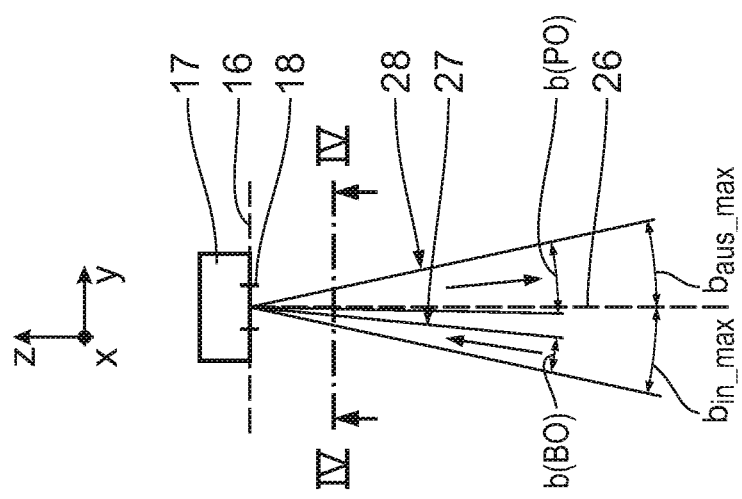
FIG. 3 shows an enlarged detail of the region III in the beam path of the projection exposure apparatus according to FIG. 1.

FIGS. 3 and 4 schematically illustrate by way of example the beam 27 of the illumination optical unit 23 in the region of the reticle 17 and the beam 28 of the projection optical unit 19 in the region of the reticle 17. A dashed line 29 in FIG. 4 illustrates the plane of the drawing of FIG. 3.

The maximum extent of the beam 27 of the illumination optical unit 23, that is to say the object-side aperture of the illumination optical unit 23, and that of the projection optical unit 19 are illustrated. The corresponding region is not necessarily completely filled with illumination radiation (see for example the exemplary illustration in FIG. 2).

As is illustrated by way of example in FIGS. 3 and 4, the opening angle b(BO) of the beam 27 of the illumination optical unit 23 can be just about half as large as the opening angle b(PO) of the beam 28 of the projection optical unit 19 in a first direction.

The first direction can be the y-direction, that is to say the scanning direction. In a second direction perpendicular thereto, the beams 27, 28 of the illumination radiation in the beam path of the illumination optical unit 23 and in the beam path of the projection optical unit 19 can have identical opening angles (see FIG. 4).

Provision is further made for the beam 27 of the illumination radiation in the illumination optical unit 23 to be tilted relative to the reticle 17 such that the maximum angle of incidence b m max of the illumination radiation at the reticle 17 is just about as large as the maximum angle of reflection $b_{aus\_max}$ of the illumination radiation that is specularly reflected at the reticle 17.

Owing to the different openings of the beams 27, 28 in the beam path of the illumination optical unit 23 and in the beam path of the projection optical unit 19, the surface normal 26 on the reticle 17 lies completely in the region of the beam 28 of the projection optical unit 19.

When using an anamorphic projection optical unit 19, some embodiment involve selecting the magnification scales in such a way that the total angular extent is identical in the x- and y-directions. The extent of the radiation beam 28 of the illumination radiation in the beam path of the projection optical unit 19 in the angle space can be 50% greater in the x-direction than in the y-direction. As a result, the maximum angle of a beam with respect to the normal of the reticle is independent of the direction.

Although the surface normal 26 of the reticle 17 lies completely in the beam path of the projection optical unit 19, the first two mirrors (e.g., the first three mirrors, the first four mirrors) in the beam path of the projection optical unit 19 can have a simply contiguous reflection surface. They can have a reflection surface which is not fractionated.

FIG. 4 shows by way of example that the specularly reflected zero order of the illumination radiation is completely (hatched region 30) contained in the beam 28 of the projection optical unit 19. The beam 28 of the projection optical unit 19 moreover contains parts of higher orders (unshaded region 31). However, the beam 28 of the projection optical unit 19 only contains parts of higher orders that lie on one side of the region 30 of the zero order, such as in the y-direction. The parts of higher orders lie, for example, in a region between the beam 27 of the illumination optical unit 23 and the specular reflection thereof.

As can further be seen from FIG. 4, the opening of the beam 27 of the illumination optical unit 23 is reduced only in the first direction, for example the y direction. In a second direction perpendicular thereto, for example the x-direction, there is no reduction in the opening of the beam 27.

The beam 27 of the illumination optical unit 23 thus has different maximum extents. In an anamorphic system, the maximum extents are to be taken in the corresponding direction relative to the numerical aperture of the projection optical unit.

Figure 6:
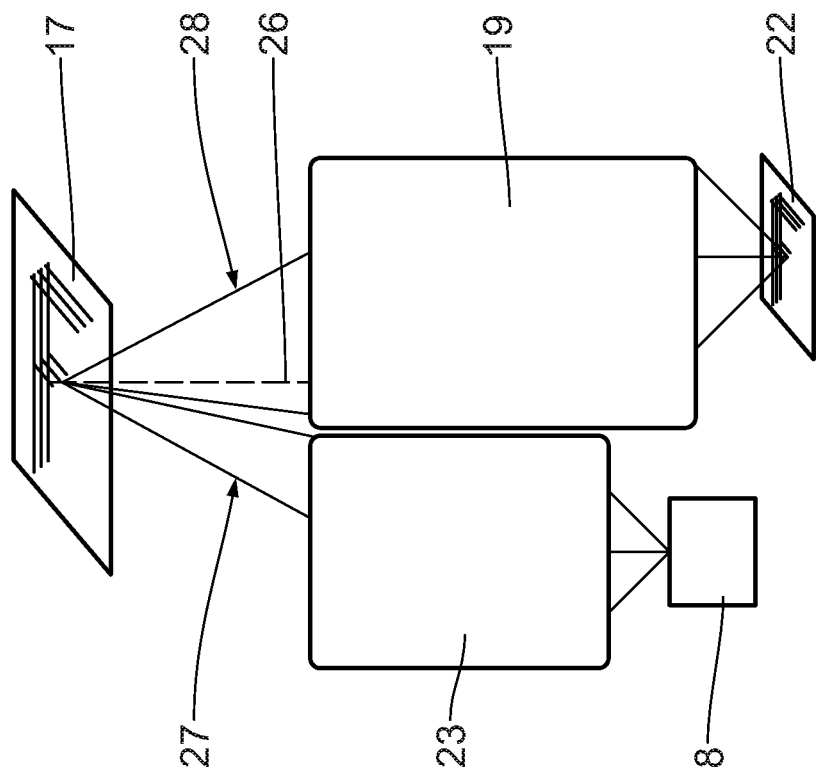
FIG. 6 schematically shows the arrangement of the reticle and wafer in a subsequent second exposure step.
Figure 5:
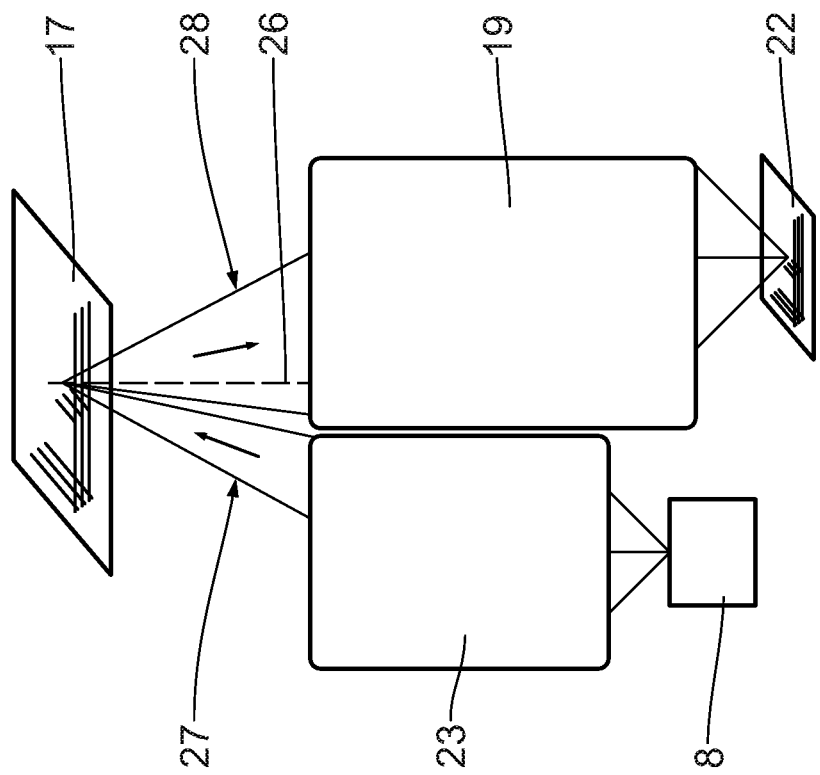
FIG. 5 schematically shows the arrangement of the reticle and wafer in a first exposure step.

According to the disclosure, it has been recognized that the consequence of the previously described halving of the illumination pupil to the imaging of the reticle 17 onto the wafer 22 can be compensated by a double exposure. In this double exposure, the two complementary halves of the illumination pupil are used sequentially for imaging the reticle 17 onto the wafer 22. In this case, the optical system 24 of the projection exposure apparatus 1 remains unchanged, while the reticle 17 and the wafer 22 are rotated about the optical axis. The reticle 17 and the wafer 22 are rotated for example through 180° about the optical axis. The arrangements of the reticle 17 and of the wafer 22 in the two exposure steps are shown by way of example in FIGS. 5 and 6.

It should be noted that the double exposure just described can be advantageous, but is not necessary. Without this double exposure, a focus error or a z-position error of the reticle and/or wafer leads to a shift and to a fading of the structures produced on the wafer. The shift can be significantly reduced with the double exposure described, but this can be accompanied by an increase in the fading of the structures. Depending on the desired application of the projection exposure apparatus, the described double exposure can therefore be desirable, be advantageous but not necessary, or be disadvantageous.

The reticle holder 17a serves to rotate the reticle 17.

The wafer holder 22a serves to rotate the wafer 22.

From the perspective of the reticle 17, the structures thereof are illuminated in each case with complementary halves of the illumination pupil in the two exposure steps.

With the aid of the solution described above, the maximum angle of incidence/angle of reflection of the illumination radiation at the reticle can be reduced by 25%.

What is claimed is:

1. An optical system, comprising:
    an illumination optical unit; and
    a projection optical unit having an object field and an image field,
    wherein:
        the illumination optical unit is configured to transfer illumination radiation to the object field;
        the projection optical unit is configured to project a reticle in the object field to a light-sensitive material in the image field;
        for illumination radiation that exits the illumination optical unit and impinges on the reticle, the illumination radiation has a first range of angles in a first direction;
        for illumination radiation that is reflected by the reticle, passes through the projection optical unit and impinges on the light-sensitive material, the illumination radiation has a second range of angles in the first direction; and
        the second range of angles in the first direction is twice as large as the first range of angles in the first direction.

2. The optical system of claim 1, wherein the reticle is tilted relative to a beam path of the illumination radiation so that a surface normal of the reticle lies entirely in the beam of the illumination radiation of the projection optical unit.

3. The optical system of claim 1, further comprising a semicircular pupil facet mirror.

4. The optical system of claim 1, wherein the projection optical unit has an object-side numerical aperture of at least 0.55.

5. The optical system of claim 1, wherein:
    for the illumination radiation that exits the illumination optical unit and impinges on the reticle, the illumination radiation has a first range of angles in a second direction;
    for the illumination radiation that is reflected by the reticle, passes through the projection optical unit and impinges on the light-sensitive material, the illumination radiation has a second range of angles in the second direction; and
    the second range of angles in the second direction is the same as the first range of angles in the second direction.

6. The optical system optical system of claim 1, wherein the reticle is shorter in the first direction than in a second direction perpendicular to the first direction.

7. The optical system optical system of claim 1, wherein both the reticle and the light-sensitive material are rotatable through 180° in each case.

8. The optical system of claim 1, wherein the projection optical unit comprises a plurality of mirrors, and the first two mirrors in the beam path of the projection optical unit comprise a simply contiguous reflection surface.

9. The optical system of claim 1, wherein an envelope of beams of the projection optical unit does not overlap an envelope of beams of the illumination optical unit.

10. The optical system of claim 1, wherein the illumination optical unit has an exit-side maximum aperture that is at most 70% as large in a first direction as in a second direction perpendicular thereto.

11. The optical system of claim 10, wherein the illumination optical unit comprises a semicircular pupil facet mirror.

12. The optical system of claim 1, wherein the optical system is configured so that only half of an illumination pupil is used to illuminate the reticle.

13. The optical system of claim 1, wherein the optical system is configured so that only one half of a dipole setting is used to illuminate the reticle.

14. The optical system of claim 1, wherein the optical system is configured so an illumination setting corresponding to precisely one pole of a dipole setting is used to illuminate the reticle.

15. An apparatus, comprising:
    an optical system according to claim 1; and
    a radiation source configured to generate illumination radiation,
    wherein the apparatus is a microlithographic projection exposure apparatus.

16. A method, comprising:
    a) providing an optical system according to claim 1;
    b) using the illumination optical unit to illuminate the reticle; and
    c) using the projection optical unit to project structures of the reticle onto the second object.

17. The method of claim 16, wherein the same structures of the reticle are imaged twice onto the same regions of the light-sensitive material using mutually exclusive halves of an illumination pupil.

18. The method of claim 16, further comprising:
    after c), rotating the reticle and the light-sensitive material through 180° in each case about an optical axis of the optical system; and
    after d), using the projection optical unit to project the reticle onto the light-sensitive material.

19. The optical system of claim 1, wherein:
    the reticle is tilted relative to a beam path of the illumination radiation so that a surface normal of the reticle lies entirely in the beam of the illumination radiation of the projection optical unit; and
    the optical system further comprises a semicircular pupil facet mirror.

20. The optical system of claim 1, wherein:
    the reticle is tilted relative to a beam path of the illumination radiation so that a surface normal of the reticle lies entirely in the beam of the illumination radiation of the projection optical unit; and
    the projection optical unit has an object-side numerical aperture of at least 0.55.

21. The optical system of claim 1, wherein:
    the reticle is tilted relative to a beam path of the illumination radiation so that a surface normal of the reticle lies entirely in the beam of the illumination radiation of the projection optical unit;

for the illumination radiation that exits the illumination optical unit and impinges on the reticle, the illumination radiation has a first range of angles in a second direction;

for the illumination radiation that is reflected by the reticle, passes through the projection optical unit and impinges on the light-sensitive material, the illumination radiation has a second range of angles in the second direction; and the second range of angles in the second direction is the same as the first range of angles in the second direction.

22. The optical system of claim 1, wherein:

the reticle is tilted relative to a beam path of the illumination radiation so that a surface normal of the reticle lies entirely in the beam of the illumination radiation of the projection optical unit; and the reticle is shorter in the first direction than in a second direction perpendicular to the first direction.

23. The optical system of claim 1, wherein:

the reticle is tilted relative to a beam path of the illumination radiation so that a surface normal of the reticle lies entirely in the beam of the illumination radiation of the projection optical unit; and both the reticle and the light-sensitive material are rotatable through 180° in each case.

24. The optical system of claim 1, wherein:

the reticle is tilted relative to a beam path of the illumination radiation so that a surface normal of the reticle lies entirely in the beam of the illumination radiation of the projection optical unit; and the projection optical unit comprises a plurality of mirrors, and the first two mirrors in the beam path of the projection optical unit comprise a simply contiguous reflection surface.

25. The optical system of claim 1, wherein:

the reticle is tilted relative to a beam path of the illumination radiation so that a surface normal of the reticle lies entirely in the beam of the illumination radiation of the projection optical unit; and an envelope of beams of the projection optical unit does not overlap an envelope of beams of the illumination optical unit.

* * * * *